United States Patent
Roohparvar et al.

(10) Patent No.: US 6,678,201 B2
(45) Date of Patent: Jan. 13, 2004

(54) DISTRIBUTED FIFO IN SYNCHRONOUS MEMORY

(75) Inventors: Frankie Fariborz Roohparvar, Milpitas, CA (US); Dean Nobunaga, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 10/118,281

(22) Filed: Apr. 8, 2002

(65) Prior Publication Data

US 2003/0189867 A1 Oct. 9, 2003

(51) Int. Cl.$^7$ .................................. G11C 7/00
(52) U.S. Cl. .................. 365/221; 365/189.05; 365/207; 365/233; 365/239
(58) Field of Search ................... 365/221, 189.05, 365/194, 207, 233, 239

(56) References Cited

U.S. PATENT DOCUMENTS

| | | | |
|---|---|---|---|
| 6,115,760 A | | 9/2000 | Lo et al. |
| 6,163,501 A | * | 12/2000 | Ohshima et al. ............ 365/233 |
| 6,201,760 B1 | * | 3/2001 | Yun et al. ................... 365/233 |
| 6,427,197 B1 | * | 7/2002 | Sato et al. .................. 711/169 |
| 6,504,767 B1 | * | 1/2003 | Brown .................. 365/189.05 |

* cited by examiner

*Primary Examiner*—Richard Elms
*Assistant Examiner*—Toan Le
(74) *Attorney, Agent, or Firm*—Leffert Jay & Polgalze, P.A.

(57) ABSTRACT

A synchronous memory device includes a distributed FIFO buffer in a read path. Buffer stages of the FIFO are located at remote ends of an internal data bus. The time needed for loading the first FIFO stage is reduced and allows shorter clock cycle times for some memory read operations.

18 Claims, 7 Drawing Sheets

DISTRIBUTED FIFO IN SYNCHRONOUS MEMORY

FIELD OF THE INVENTION

The present invention relates generally to memory devices and in particular the present invention relates to a synchronous memory device having FIFO read buffers.

BACKGROUND OF THE INVENTION

Synchronous memory devices have become the standard for high-speed systems. These systems allow input signals to be presented to the memory devices on a given clock edge and hence reduce the likelihood of asynchronous activities causing bad functionality. One of the above-described memories is a synchronous dynamic random access memory (SDRAM) device, and the functionality of SDRAM devices is well known and understood. Another synchronous memory is a synchronous nonvolatile device called Synchronous Flash that has the same interconnect design as SDRAM and behaves like an SDRAM device for reading. Due to the fact that the synchronous flash is non-volatile, write operations are done differently than an SDRAM. For read operation, however, the synchronous flash has external command timing that is exactly like an SDRAM.

It is perhaps useful to describe the operation of the data read function in more detail. As mentioned above, the reading of the Synchronous flash device is done synchronously, and an active command is presented to the memory on a rising edge of an externally provided clock signal. This command opens up a page of the non-volatile memory array. The page can be different length based on a particular design, such as 4K to 8K bits wide. By opening the page, the device does an internal read of all the memory cells that are placed on that row line or page and stores them in a latch for further access. A Read command and column address are then presented to the memory on a rising edge of the clock three cycles later. The three cycle delay from the active command receipt is required to satisfy a specification of active to read that is about 30 ns on some 100 MHz SDRAM device types, which is the same as the Synchronous flash device.

In general during the read operation, data is retrieved from the active page and presented on output data connections. There is latency relative to the clock of how many cycles of the clock it takes for the device to output the data corresponding to the address of the column that was presented to the part during the read command. After the latency has been satisfied, the memory outputs data. Data may be presented on every consecutive clock edge. Either the data corresponding to further read commands or data in the locations adjacent to the original address in a burst fashion. This is in case the burst length has been set to a number higher than one in an internal mode register. For example, a burst length of eight would require a read command and after the latency (in this case 3) has been satisfied, the memory would output the data corresponding to the column address present on the address bus during the read command and sequentially output the next seven column address locations on the next seven rising edges of the clock.

The prior art architecture that supported such functionality included high speed decoding of the location in the open page or YMUX. A FIFO buffer is provided in series the output path to provide the read latency. For example, in 100 MHz memory devices with a three-clock cycle read latency the FIFO has three stages. This FIFO is typically located next to the output buffers to assist in meeting tight access time specification requirements defined from an edge of the clock signal to when the data appears at the output data connections. Since this is a very difficult specification to satisfy, the memory designers place the FIFO proximate to the output buffer so that once the FIFO opens up the data is presented to the output buffer for immediate and least delay to get to the output connections.

As the speed of the memory devices become faster, the total read delay to decode the column address, output sense amplifier latches to secondary sense amps, and place the data on a general bus to provide the data to the FIFO next to the output buffers is becoming a limiting factor in achieving faster operating speeds.

For the reasons stated above, and for other reasons stated below which will become apparent to those skilled in the art upon reading and understanding the present specification, there is a need in the art for a methods and circuits to increase the operating read times of synchronous memory devices while providing the required read latency.

SUMMARY OF THE INVENTION

The above-mentioned problems with memory devices and other problems are addressed by the present invention and will be understood by reading and studying the following specification.

In one embodiment, a synchronous non-volatile memory device comprises an array of memory cells arranged in columns, sense amplifier circuitry coupled to the columns of the array, and a first FIFO buffer stage coupled to the sense amplifier circuitry. An internal communication line traversing the memory device. A driver circuit is coupled between the first FIFO buffer stage and the internal communication line, and a second FIFO buffer stage located remotely from the first FIFO buffer stage and is coupled to receive an output from the first FIFO buffer stage via the internal communication line.

In another embodiment, a synchronous memory device comprises a differential sense amplifier, a first pass circuit coupled to the differential sense amplifier, a first latch circuit coupled to the first pass circuitry, a second pass circuit coupled to the first latch circuit, and a first FIFO buffer stage coupled to the second pass circuit. A data driver circuit is coupled between the first FIFO buffer stage and an internal data line. The memory comprises a second latch circuit coupled to the internal data line remote from the data driver circuit, a third pass circuit coupled to the second latch circuit, a second FIFO buffer stage coupled to the third pass circuit, a fourth pass circuit coupled to the second latch circuit, and a third FIFO buffer stage coupled to the fourth pass circuit.

A method of operating a synchronous memory device comprises initiating a read operation on a first clock cycle, sensing data stored in a memory cell during the first clock cycle, latching the sensed data during the first clock cycle, and coupling the latched data to a first FIFO buffer stage during the first clock cycle. An output of the first FIFO buffer stage is driven on an internal data line during a second subsequent clock cycle, and the internal data line is coupled to a second FIFO buffer stage during the second clock cycle.

DETAILED DESCRIPTION OF THE DRAWINGS

Figure 1:
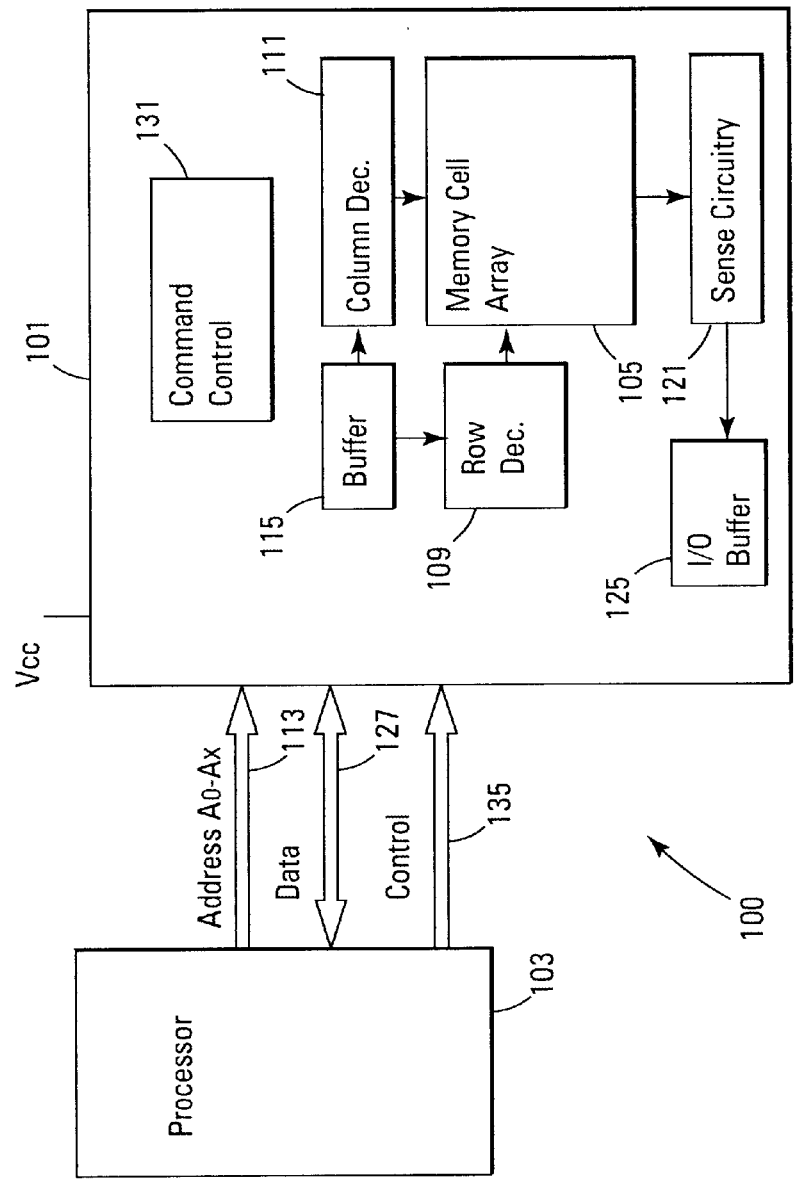
FIG. 1 is a functional block diagram of a flash memory device of one embodiment of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

As explained above, prior synchronous memory devices include a FIFO buffer that is located in close proximity to data connections. The FIFO typically includes multiple stages corresponding to a read clock latency of the memory. The operation of prior synchronous memory devices can be analyzed by looking at the steps corresponding to clock cycles. In the first clock cycle of the read operation, the column address is decoded and the memory cells of the column are accessed. The data of the accessed memory cells are sensed using a sense amplifier, the sense amplifier signals are output to secondary sense amplifiers, and the secondary sense amplifier data is placed on an internal general bus to provide the data to the FIFO located next to the output buffers. During the second clock cycle, the data is transferred from the first stage of the FIFO to the second stage. On the third clock cycle, the data is presented to the output buffer that drive the data to the output (DQ) connections.

There is a lot of pressure on the timing events in the first clock cycle and almost no pressure on the second and third clock cycles. Assuming that it takes about 5 ns to decode the column addresses, access and sense memory cells, and couple the output of the sense amplifiers to the secondary sense amplifiers. Now further assuming that the output of the secondary sense amplifiers is coupled to a bus with large signal driver circuits to communicate the data to the FIFO. During the first clock cycle of a 3-cycle latency read operation, 10 ns is typically required to couple the data to the first FIFO stage. Thus, the memory device could operate at a maximum speed of 100 MHz (10 ns cycle time).

The present invention provides distributed FIFO stages to allow for higher performance. As explained below, a synchronous memory device of an embodiment of the present invention has the FIFO stages distributed through the output data path. In one embodiment, the first FIFO stage is located in close proximity to the output of the secondary sense amplifiers. The next stages of FIFO are located right next to the output buffer. With this embodiment, the first clock cycle only needs to be 5 ns to decode the addresses, access the memory cells and output the secondary sense amplifiers to the first FIFO stage. During the second clock cycle, the output of the first stage is communicated to the second stage via a bus. During the third cycle, the output is coupled to the output buffer circuit, which in turn drives data on the DQ lines accordingly. By distributing the FIFO stages, the memory device can run with 5 ns clock periods, which translates into 200 MHz performance. Also by having the second stage of the FIFO at the output buffer, there is no loss in performance relative to the prior art with respect to the access time either.

FIG. 1 is a functional block diagram of a flash memory device 101, of one embodiment of the present invention, that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

An address buffer circuit 115 is provided to latch address signals provided on address lines A0–Ax 113. Address signals are received and decoded by row decoder 109 and a column decoder 111 to access the memory array 105. Sensing circuitry 121 is used to sense and amplify data stored in the memory cells. Data input and output buffer circuitry 125 is included for bidirectional data communication over a plurality of data (DQ) lines 127 with the processor 103.

Command control circuit 131 decodes signals provided on control lines 135 from the processor 103. These signals are used to control the operations on the memory array 105, including data read, data write, and erase operations.

Figure 2A:
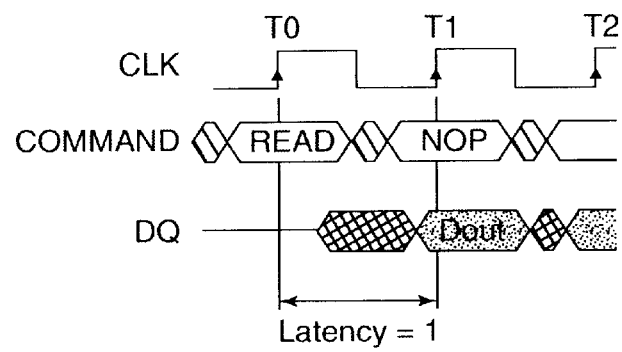
FIGS. 2A, 2B and 2C are timing diagrams illustrating read latency of the memory of FIG. 1.
Figure 2B:
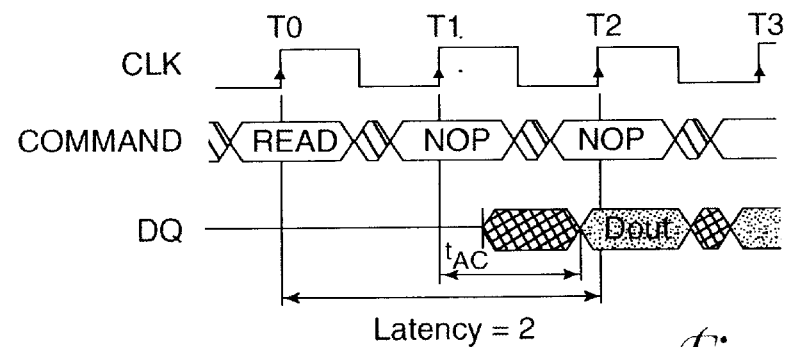
Figure 2C:
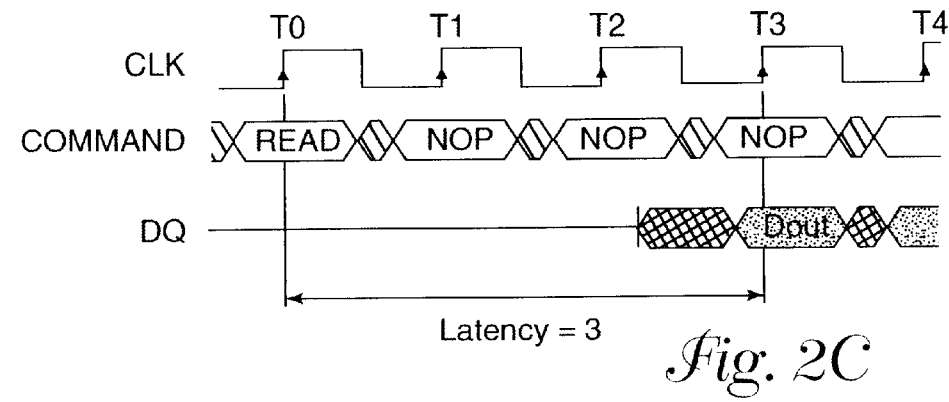

Referring to FIGS. 2A, 2B and 2C, the read latency of the memory of FIG. 1 is described. In FIG. 2A, a clock latency of one provides data, Dout, on the clock cycle following the Read command. A clock latency of two, as illustrated in FIG. 2B, provides Dout on the second clock cycle following the Read command. Likewise, a clock latency of three provides data Dout on the third clock cycle following the Read command, see FIG. 2C.

As stated above, the flash memory device 101 has been simplified to facilitate a basic understanding of the features of the memory. A more detailed understanding of flash memories is known to those skilled in the art.

Figure 3A:
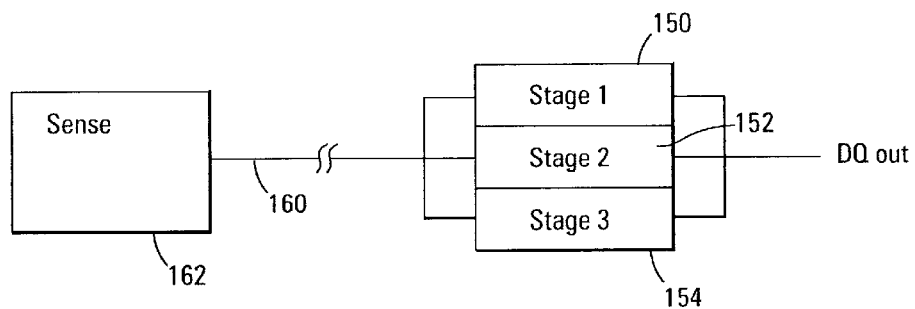
FIG. 3A is a block diagram of a prior art FIFO buffer.

FIG. 3A is a block diagram of a prior art FIFO buffer. The buffer includes three stages 150, 152 and 154 that are coupled in parallel at the end of an internal bus 160 from sensing circuitry 162. The stages are clocked in a manner that provides the required latency. For example, in a three clock latency operation, the first buffer stage 150 is loaded while the second 152 is output. The second 152 is loaded while the third 154 is output and then the first 150 is output while the third is loaded. This rotation of the buffer stages provides the necessary latency for a synchronous memory.

Figure 3B:
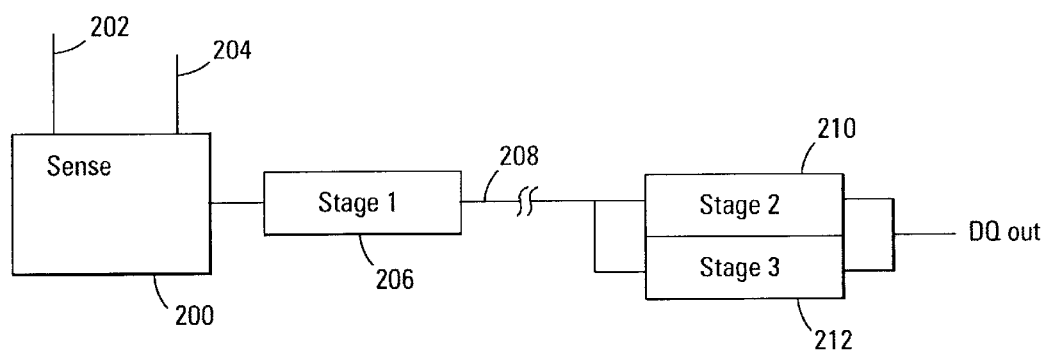
FIG. 3B is a block diagram illustrating the basic orientation of the FIFO stages of an embodiment of the present invention.

FIG. 3B is a block diagram illustrating the basic orientation of the FIFO stages of an embodiment of the present invention. The present flash memory includes a sense amplifier circuit 200 coupled to bit lines 202/204 of the memory array. The outputs of the sense amplifier circuit are coupled to a first FIFO stage 206. This is substantially different from prior flash memory devices. The output of the first FIFO stage is coupled to internal communication lines 208 that traverse the memory die and are coupled to a second 210 and third 212 FIFO stages located in proximity to output driver circuitry. In contrast to prior flash memory devices, the first and second FIFO stages are not directly coupled in parallel.

Figure 4:
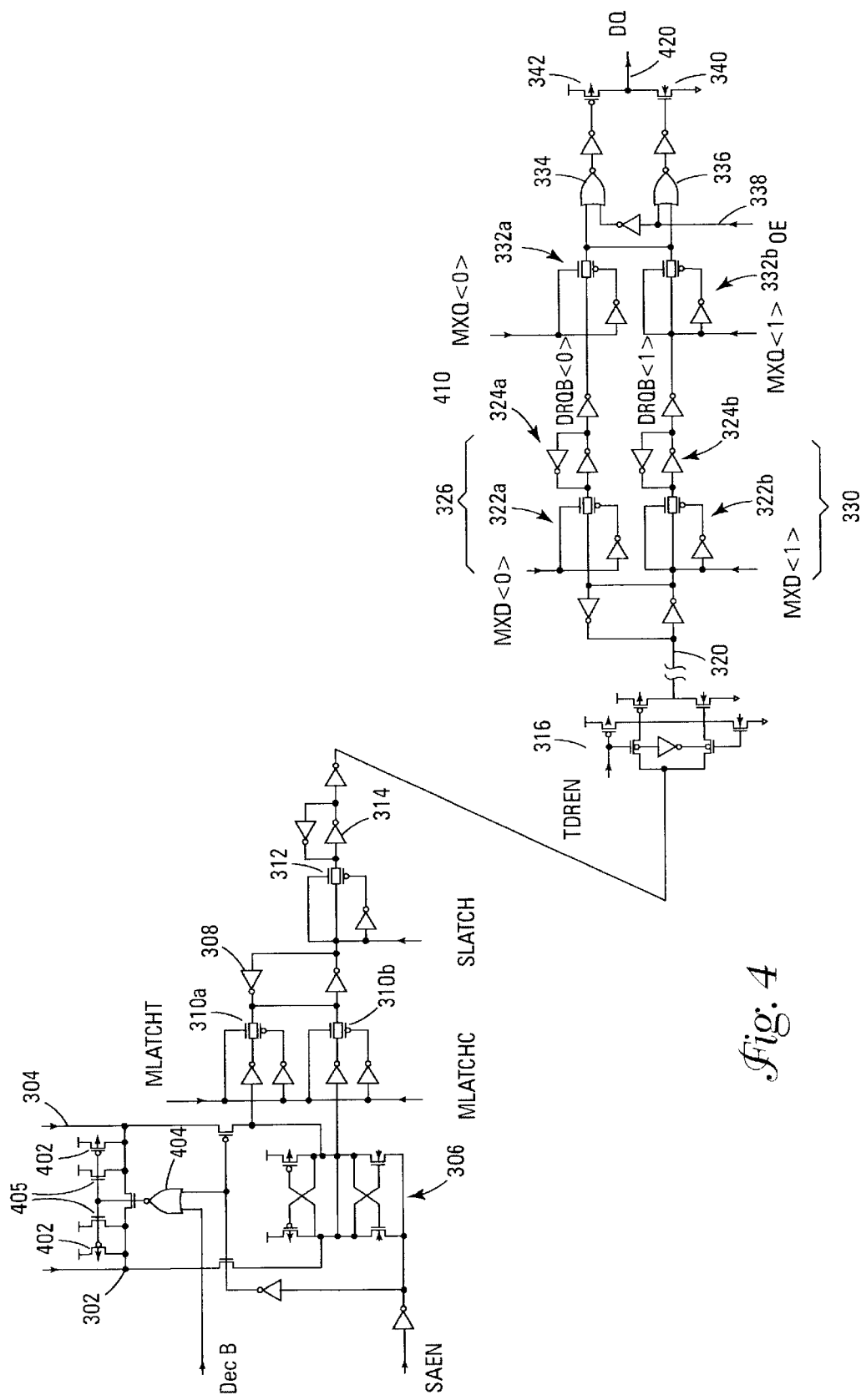
FIG. 4 is a schematic diagram illustrating a buffer circuit of an embodiment of the present invention.

Referring to FIG. 4, a schematic diagram of a portion of a flash memory of the present invention is described. The memory array has numerous columns 302/304 (digit lines) that are coupled to sense amplifier circuitry 306. For purposes of clarity, only one pair of digit lines are illustrated in FIG. 3. The digit lines are coupled to a differential sense amplifier circuit that is coupled to a latch circuit 308 through pass circuitry 310. The sense amplifier latch 308 is coupled to a first FIFO buffer stage 314 through pass circuit 312. The first FIFO stage includes a driver circuit 316 that can drive the sensed data across an internal bus line 320. The driver can be tri-stated when it is not active. A second FIFO stage 326 is coupled to the remote end of the bus. The second stage includes pass circuit 322a and a latch 324a and pass circuitry 332a. A difference between the present invention and prior memory devices is the placement of the driver circuit 316 between the first and second FIFO stages. A third FIFO stage 330 is coupled in parallel to the second stage. The third FIFO stage includes pass circuitry 322b, latch 324b and pass circuitry 332b. Output driver circuitry is coupled to the second and third stages and includes NOR/NAND gates 334/336. The gates include an output enable (OE) input 338. Driver transistors 340/342 are provided to drive the output signal on the external DQ connections. Pass circuitry 332a and 332b are used to couple the FIFO stages to the output driver.

Figure 5:
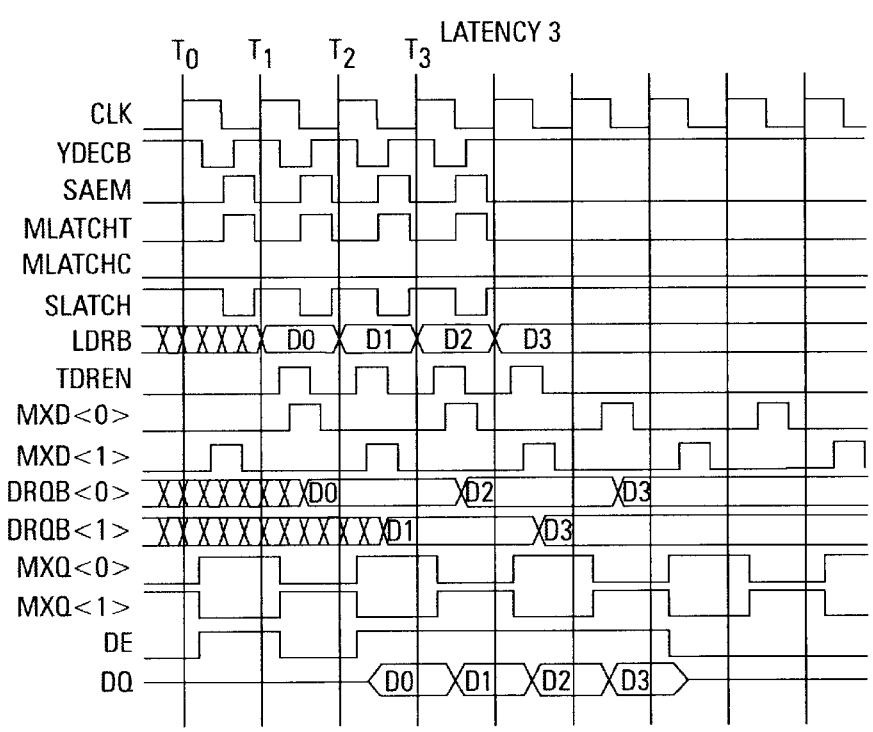
FIGS. 5–7 are timing diagrams of operation of the circuit of FIG. 4.
Figure 6:
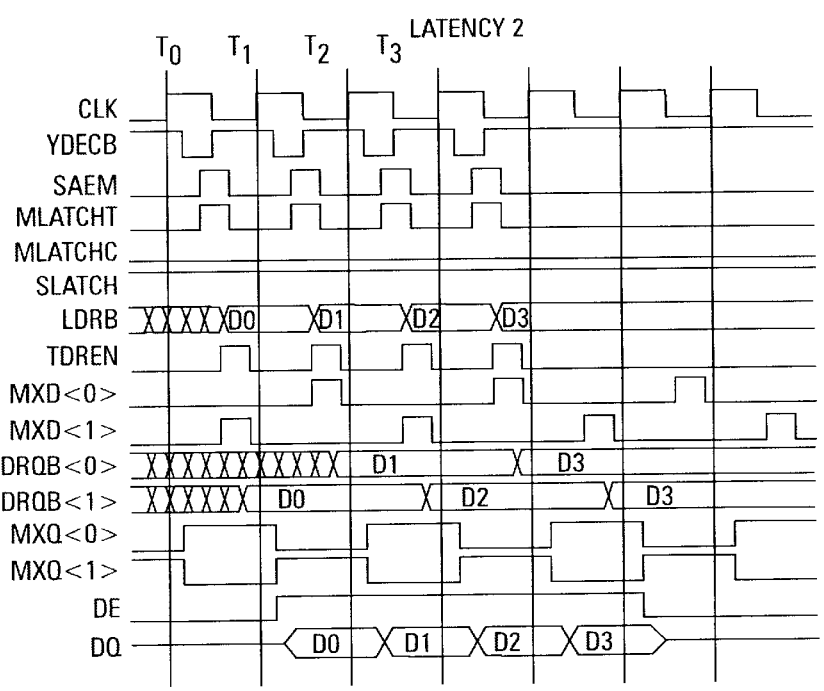
Figure 7:
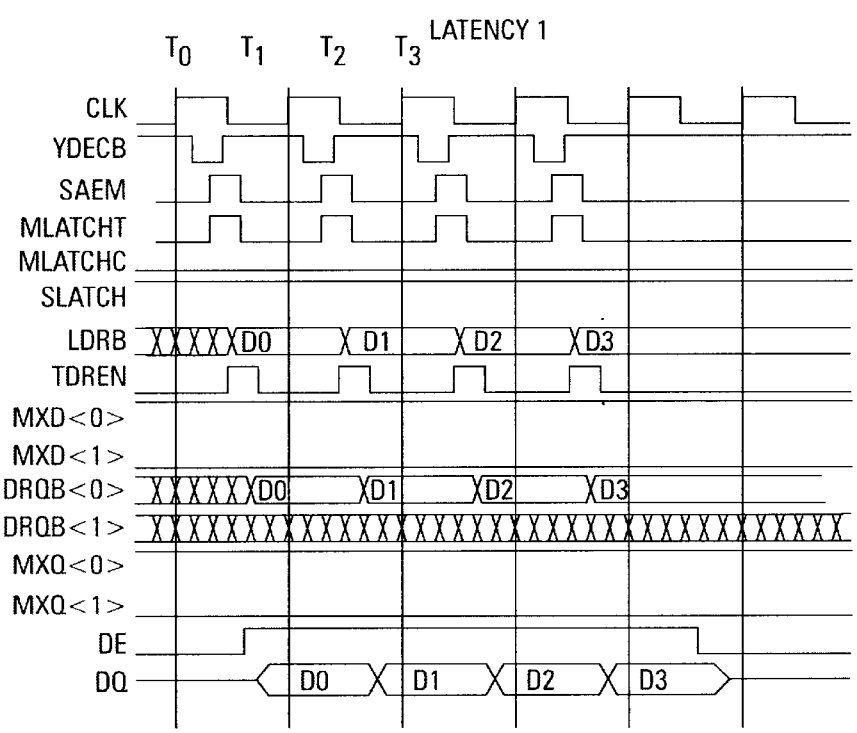

Referring to FIGS. 5–7, timing of the above circuit is described. FIG. 5 illustrates memory read operations using a three-clock latency. As known to those skilled in the art, a latency of 3 clocks indicates that output data is valid on the third clock cycle following a read initiation, see FIG. 2c. In the present timing diagram, T0 is the rising clock signal that initiates a read operation.

Initially, the bit lines 302 and 304 are precharged by p-channel transistors 402 and NOR gate 404. When YDECB goes low, the p-channel transistors are turned off and a differential voltage is created between the bit lines. N-channel transistors 405 are provided to clamp the differential between the bit lines for power consumption reasons.

During the first clock cycle, the sense amplifier 306 is coupled to the digit lines using the sense amplifier enable signal (SAEN). While the sense amplifier is active, pass circuit 310a or 310b is activated by signal MLATCHT or MLATCHC to latch the sensed data. As illustrated, only one pass circuit is active to latch the from the digit line with the active memory cell. During the first clock cycle, pass circuit 312 is also activated to couple the data to the first FIFO stage 314. At this time, the read data, D0, is provided to the input of the tri-state driver circuit 316.

During the second clock cycle, the tri-state driver 316 is activated (TDREN goes high) to drive the data signal on the internal bus 320. Also, pass circuitry 322a is activated to latch the data in the second FIFO stage 324a. At the end of the second clock cycle the data is available at node 410. On the third clock cycle, pass circuit 332a is activated to load the NAND 336 and NOR 334 gates. The Output Enable (OE) signal 338 is used to drive the output data on the DQ connection 420. On the third clock signal following T0, therefore, the output data is valid.

FIG. 6 illustrates the operation of the circuitry of FIG. 4 in a two clock latency read operation. The primary difference is that pass circuitry 310a, 312 and 322b and the tri-state driver 316 are activated in the first clock cycle. Thus, the third stage 326 of the FIFO is loaded on the first cycle. Again, the time needed to drive the data on the internal bus 320 and load the third FIFO stage limits the clock operating speed. Pass circuitry 322b is activated on the second clock cycle and the output data is available on DQ 420 at time T2.

FIG. 7 illustrates the operation of the circuitry of FIG. 4 in a one clock latency read operation. The primary difference is that pass circuitry 310a, 312, 322a and 332a and the tri-state driver 316 are activated in the first clock cycle. The OE signal 338 is activated and the output data is available on DQ 420 at time T1. While less clock cycles are required for a latency of one, the clock cycle is longer than other latency operations.

CONCLUSION

A synchronous memory device has been described that includes a distributed FIFO buffer in a read path. Buffer stages of the FIFO are located at remote ends of an internal data bus.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A synchronous non-volatile memory device comprising:
    an array of memory cells arranged in columns;
    sense amplifier circuitry coupled to the columns of the array;
    a first FIFO buffer stage coupled to the sense amplifier circuitry;
    an internal communication line traversing the memory device;
    a driver circuit coupled between the first FIFO buffer stage and the internal communication line, the drive circuit providing extra drive capability for sensed data from the sense amplifier circuitry along the internal communication line; and
    a second FIFO buffer stage located remotely from the first FIFO buffer stage and coupled to receive an output from the first FIFO buffer stage via the internal communication line.

2. The synchronous non-volatile memory device of claim 1 further comprising a third FIFO buffer stage located adjacent to the second FIFO buffer stage and coupled in parallel to the second FIFO buffer stage.

3. The synchronous non-volatile memory device of claim 1 further comprising an output driver circuit coupled to the output of the second FIFO buffer stage, the driver circuit comprises logic circuitry enabled by an output enable signal.

4. The synchronous non-volatile memory device of claim 1 wherein the memory cells are floating gate transistors.

5. The synchronous non-volatile memory device of claim 1 wherein the driver circuit is a tri-state driver that can place the internal communication line in a tri-state condition.

6. A synchronous memory device comprising:
    a differential sense amplifier;
    a first pass circuit coupled to the differential sense amplifier;

a first latch circuit coupled to the first pass circuitry;
a second pass circuit coupled to the first latch circuit;
a first FIFO buffer stage coupled to the second pass circuit;
a data driver circuit coupled between the first FIFO buffer stage and an internal data line, the data drive circuit providing extra drive capability for sensed data from the sense amplifier circuitry along the internal data line;
a second latch circuit coupled to the internal data line remote from the data driver circuit;
a third pass circuit coupled to the second latch circuit;
a second FIFO buffer stage coupled to the third pass circuit;
a fourth pass circuit coupled to the second latch circuit; and
a third FIFO buffer stage coupled to the fourth pass circuit.

7. The synchronous memory device of claim 6 wherein the data driver circuit is a tri-state driver that can place the internal data line in a tri-state condition.

8. The synchronous memory device of claim 6 wherein the first FIFO buffer stage comprises a pair of reverse coupled inverter circuits.

9. The synchronous memory device of claim 6 wherein the second and third FIFO buffer stages are coupled in parallel and each comprise a pair of reverse coupled inverter circuits.

10. A synchronous memory device comprising:
a differential sense amplifier;
a first pass circuit coupled to the differential sense amplifier;
a first latch circuit coupled to the first pass circuitry;
a second pass circuit coupled to the first latch circuit;
a first FIFO buffer stage coupled to the second pass circuit;
a data driver circuit coupled between the first FIFO buffer stage and an internal data line;
a second latch circuit coupled to the internal data line remote from the data driver circuit;
a third pass circuit coupled to the second latch circuit;
a second FIFO buffer stage coupled to the third pass circuit;
a fourth pass circuit coupled to the second latch circuit; and
a third FIFO buffer stage coupled to the fourth pass circuit;
an output driver circuit coupled to the outputs of the second and third FIFO buffer stages, the driver circuit comprises logic circuitry enabled by an output enable signal;
a NOR gate coupled to activate a pull-up circuit; and
a NAND gate coupled to activate a pull-down circuit.

11. A method of operating a synchronous memory device comprising:
initiating a read operation on a first clock cycle;
sensing data stored in a memory cell during the first clock cycle;
latching the sensed data during the first clock cycle;
coupling the latched data to a first FIFO buffer stage during the first clock cycle;
driving an output of the first FIFO buffer stage on an internal data line during a second subsequent clock cycle; and
coupling the internal data line to a second FIFO buffer stage during the second clock cycle.

12. The method of claim 11 further comprises driving data from the second FIFO buffer stage on an external data connection.

13. A method of operating a synchronous memory device comprising:
initiating a read operation on a first clock cycle;
sensing data stored in a memory cell during the first clock cycle;
latching the sensed data during the first clock cycle;
coupling the latched data to a first FIFO buffer stage during the first clock cycle;
driving an output of the first FIFO buffer stage on an internal data line during a second subsequent clock cycle;
coupling the internal data line to a second FIFO buffer stage during the second clock cycle; and
driving data from the second FIFO buffer stage on an external data connection.

14. The method of claim 13 wherein driving the output of the first FIFO buffer stage is performed by a driver circuit located between the first FIFO buffer stage and the internal data line.

15. The method of claim 14 wherein the driver circuit is a tri-state driver circuit.

16. The method of claim 13 wherein the first FIFO buffer stage comprises a pair of reverse coupled inverter circuits.

17. A method of operating a synchronous memory device comprising:
initiating a read operation on a first clock cycle;
sensing data stored in a memory cell during the first clock cycle;
latching the sensed data during the first clock cycle;
coupling the latched data to a first FIFO buffer stage during the first clock cycle;
driving an output of the first FIFO buffer stage on an internal data line during a second subsequent clock cycle;
coupling the internal data line to a second FIFO buffer stage during the second clock cycle; and
driving data from the second FIFO buffer stage on an external data connection;
activating a pull-up circuit with a NOR gate; and
activating a pull-up circuit with a NAND gate.

18. A method of operating a synchronous memory device comprising:
initiating a read operation on a first clock cycle;
sensing data stored in a memory cell during the first clock cycle;
latching the sensed data during the first clock cycle;
coupling the latched data to a first FIFO buffer stage during the first clock cycle;
driving an output of the first FIFO buffer stage on an internal data line during the first clock cycle;
coupling the internal data line to a second FIFO buffer stage during the first clock cycle; and
coupling the second FIFO buffer stage to an output driver circuit during a second subsequent clock cycle.

* * * * *